United States Patent [19]

Warren et al.

[11] Patent Number: 5,786,231

[45] Date of Patent: Jul. 28, 1998

[54] SCREENING METHOD FOR SELECTING SEMICONDUCTOR SUBSTRATES HAVING DEFECTS BELOW A PREDETERMINED LEVEL IN AN OXIDE LAYER

[75] Inventors: William L. Warren; Karel J. R. Vanheusden; James R. Schwank; Daniel M. Fleetwood; Marty R. Shaneyfelt; Peter S. Winokur, all of Albuquerque, N. Mex.; Roderick A. B. Devine, St. Martin le Vinoux, France

[73] Assignee: Sandia Corporation, Albuquerque, N. Mex.

[21] Appl. No.: 567,679

[22] Filed: Dec. 5, 1995

[51] Int. Cl.$^6$ .............................. H01L 21/66; G01R 31/26
[52] U.S. Cl. ................................................ 438/17; 324/765
[58] Field of Search ............................... 437/8, 170, 172; 257/48; 324/765, 766, 767, 768, 769, 770; 438/17

[56] References Cited

U.S. PATENT DOCUMENTS

| | | | |
|---|---|---|---|
| 3,627,589 | 12/1971 | Sprague | 148/1.5 |
| 4,837,172 | 6/1989 | Mizuno | 437/11 |
| 4,875,086 | 10/1989 | Malhi | 357/54 |
| 5,310,689 | 5/1994 | Tomozane | 437/24 |
| 5,521,524 | 5/1996 | Houston et al. | 324/765 |

OTHER PUBLICATIONS

J.-P. Colinge, *Silicon–on–Insulator Technology: Materials to VLSI;* Kluwer Academic Publishers, Boston, 1991, pp. 1–227.

R. A. B. Devine, J.-L. Leray, and J. Margail, "Ultraviolet Radiation Induced Defect Creation in Buried SiO$_2$ Layers," *Applied Physics Letters*, vol. 59, pp. 2275–2277, 28 Oct. 1991.

W.L. Warren, D. M. Fleetwood, M. R. Shaneyfelt, J. R. Schwank, P.S. Winokur, and R.A. B. Devine, "Excess–Si Related Defect Centers in Buried SiO$_2$ Thin Films," *Applied Physics Letters*, vol. 62, pp. 3330–3332, 21 Jun. 1993.

K. Vanheusden and A. Stesmans, "Characterization and Depth Profiling of E' Defects in Buried SiO$_2$," *Journal of Applied Physics*, vol. 74, pp. 275–283, 1 Jul. 1993.

J. F. Conley, Jr. and P. M. Lenahan, "Molecular Hydrogen, E' Center Hole Traps, and Radiation Induced Interface Traps in MOS Devices," *IEEE Transactions on Nuclear Science*, vol. 40, pp. 1335–1340, Dec. 1993.

(List continued on next page.)

*Primary Examiner*—Brian Dutton
*Attorney, Agent, or Firm*—John P. Hohimer

[57] ABSTRACT

A method for screening or qualifying semiconductor substrates for integrated circuit fabrication. The method comprises the steps of annealing at least one semiconductor substrate at a first temperature in a defect-activating ambient (e.g. hydrogen, forming gas, or ammonia) for sufficient time for activating any defects within on oxide layer of the substrate; measuring a defect-revealing electrical characteristic of at least a portion of the oxide layer for determining a quantity of activated defects therein; and selecting substrates for which the quantity of activated defects is below a predetermined level. The defect-revealing electrical characteristic may be a capacitance-versus-voltage (C-V) characteristic or a current-versus-voltage (I-V) characteristic that is dependent on an electrical charge in the oxide layer generated by the activated defects. Embodiments of the present invention may be applied for screening any type of semiconductor substrate or wafer having an oxide layer formed thereon or therein. This includes silicon-on-insulator substrates formed by a separation by the implantation of oxygen (SIMOX) process or the bond and etch back silicon-on-insulator (BESOI) process, as well as silicon substrates having a thermal oxide layer or a deposited oxide layer.

26 Claims, 5 Drawing Sheets

OTHER PUBLICATIONS

K. Vanheusden and A. Stesmans, "Positive Charging of Buried $SiO_2$ by Hydrogenation," *Applied Physics Letters*, vol. 64, pp. 2575–2577, 9 May 1994.

R. A. B. Devine, W. L. Warren, J. B. Xu, I. H. Wilson, P. Paillet, and J.-L. Leray, "Oxygen Gettering and Oxide Degradation During Annealing of $Si/SiO_2/Si$ Structures," *Journal of Applied Physics*, vol. 77, pp. 175–186, 1 Jan. 1995.

K. Vanheusden, A. Stesmans, and V. V. Afanas'ev, "Combined Electron Spin Resonance and Capacitance–Voltage Analysis of Hydrogen–Annealing Induced Positive Charge in Buried $SiO_2$," *Journal of Applied Physics*, vol. 77, pp. 2419–2424, 15 Mar. 1995.

A. J. Auberton–Herve, J. M. Lamure, T. Barge, M. Bruel, B. Aspar, and J. L. Pelloie, "SOI Materials for ULSI Applications," *Semiconductor International*, pp. 97–104, Oct. 1995.

ture annealing step increases the mechanical strength of
SCREENING METHOD FOR SELECTING SEMICONDUCTOR SUBSTRATES HAVING DEFECTS BELOW A PREDETERMINED LEVEL IN AN OXIDE LAYER This invention was made with Government support under Contract No. DE-AC04-94AL85000 awarded by the U.S. Department of Energy. The Government has certain rights in the invention.

FIELD OF THE INVENTION

The present invention relates in general to substrates or wafers to be used for integrated circuit (IC) fabrication, and in particular to a screening method for selecting or qualifying silicon-on-insulator substrates or wafers for IC fabrication.

BACKGROUND OF THE INVENTION

Silicon-on-insulator (SOI) technology for fabricating integrated circuits (ICs) has advantages over conventional complimentary metal-oxide semiconductor (CMOS) technology in terms of reduced power consumption at a low voltage (~1 volt) for a given speed of operation. These advantages are primarily due to a lower junction capacitance for SOI devices. As a result, SOI technology is becoming increasingly important, especially for low power, low voltage systems such as lap-top computers, personal digital assistants and personal communication systems (e.g. pagers and cellular phones).

Several methods are known to the art for forming SOI substrates. These methods are disclosed, for example, in a book by J.-P. Colinge entitled "Silicon-On-Insulator Technology: Materials to VLSI," published by Kluwer Academic Publishers (Boston, 1991), and include the separation by implantation of oxygen (SIMOX) and wafer bonding. In each method, a thin oxide ($SiO_2$) layer is formed between a thin top silicon layer and a thicker bottom silicon support portion of a SOI substrate or wafer. The SIMOX method uses an oxygen ion implantation step whereby $O^+$ ions are implanted into a surface of a monocrystalline silicon wafer at an ion energy of about 200 keV to produce a high oxygen ion concentration ($>10^{18}$ $cm^{-2}$) at a predetermined distance below the surface of the silicon wafer. The silicon wafer is subsequently annealed at a high temperature (about 1300° C.) to react the implanted oxygen ions with the silicon substrate forming the oxide layer and regenerating the crystalline quality of the silicon above the oxide layer and forming the top silicon layer. The wafer bonding method is based on bonding of two monocrystalline silicon wafers or substrates, at least one of which includes an oxide layer (e.g. a thermal oxide formed on a surface of the wafer), with the wafers being oriented during bonding so that the oxide layer is positioned between the wafers. A subsequent high temperature annealing step increases the mechanical strength of the bonded wafer interface. Then one of the silicon wafers is thinned to about 1 µm thickness by mechanical grinding and polishing, thereby forming a top silicon layer. A SOI wafer formed by this bonding process is termed a bond and etched back SOI (BESOI) wafer.

In fabricating ICs from SOI substrates, a plurality of metal-oxide semiconductor field-effect transistors (MOSFETs) are formed in the top silicon layer above the oxide layer. Such MOSFETs, formed on top of the oxide layer, have a low parasitic capacitance, near-ideal subthreshold slopes, and reduced short-channel effects; and they are generally free from latch-up paths that may be present with CMOS devices formed by conventional bulk or epitaxial technologies. As a result, ICs fabricated with SOI technology have improved radiation hardness, and superior low-power, high-speed and high-temperature operation relative to equivalent conventional CMOS ICs. Because of these advantages, considerable effort is being devoted to developing a manufacturable SOI technology.

In the development of such a manufacturable SOI technology, an important consideration is the incidence of numerous defects within the oxide layer and adjacent silicon interfaces (due primarily to oxygen vacancies, oxygen vacancy complexes, and oxygen-deficiency centers formed by silicon clusters), especially for the SIMOX method wherein such defects may result from the high-energy ion implantation and high-temperature annealing steps. The presence of such defects in quantity in the oxide layer of SOI substrates can adversely affect device performance and reduce the yield of SOI integrated circuits. Thus, a method is needed for screening a plurality of SOI substrates or wafers prior to IC fabrication so that SOI substrates may be selected that have defects in the oxide layer that are below a predetermined level. This screening method is preferably non-destructive to the top silicon layer; although, in some cases, it may be possible to remove the top silicon layer in part (e.g. near an edge of the SOI substrate that is not suitable for IC formation).

An advantage of the screening method of the present invention is that by qualifying SOI substrates as having defects below a predetermined level (i.e. known-good substrates) prior to IC fabrication a yield of acceptable ICs may be increased, thereby saving money and time.

Another advantage is that the long-term reliability of SOI ICs may be improved and the incidence of defect-related failures reduced by using the non-destructive screening method of the present invention.

A further advantage is that some preferred embodiments of the present invention are substantially non-destructive, thereby allowing either a SOI substrate manufacturer to screen or test one or more manufactured substrates at least in part to certify that defects are below a predetermined level, or an end-user of substrates (e.g. an IC manufacturer) to screen a plurality of purchased SOI substrates prior to IC fabrication.

Yet another advantage of the screening method of the present invention is that the method may be used to locally or globally measure an incidence of defects within an oxide layer formed on or in the substrate.

These and other advantages of the non-destructive screening method of the present invention will become evident to those skilled in the art.

SUMMARY OF THE INVENTION

Accordingly, it is a primary object of the present invention to provide a screening method for selecting silicon-on-insulator (SOI) substrates or wafers having defects below a predetermined level for use in integrated circuit (IC) fabrication, thereby reducing time and cost by fabricating ICs only on known-good substrates.

An additional object of the present invention is to provide a substantially non-destructive screening method that may be used by a SOI substrate manufacturer or an IC manufacturer to certify any defects in one or more SOI substrates are below a predetermined level prior to IC fabrication.

A further object of the present invention is to provide a screening method for increasing the reliability of ICs by providing known-good substrates for IC fabrication.

Still another object of the present invention is to provide a method for locally or globally revealing and measuring any defects in one or more SOI substrates prior to any process steps for fabricating ICs on the substrates.

An additional object of the present invention is to provide a screening method that is applicable to many different types of silicon substrates, each having an oxide layer formed on or within the substrate.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a screening method for selecting one or more silicon-on-insulator substrates for integrated circuit fabrication is provided. The screening method comprises the steps of: annealing the substrates at a first temperature in a defect-activating ambient for sufficient time to activate any defects within the oxide layer; measuring a defect-revealing electrical characteristic (e.g. an electrical charge in the oxide layer or a variation in a drain-to-source current of a pseudo-MOSFET device) of at least a portion of the oxide layer for determining a quantity of activated defects therein; and selecting substrates for which the quantity of activated defects is below a predetermined level.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
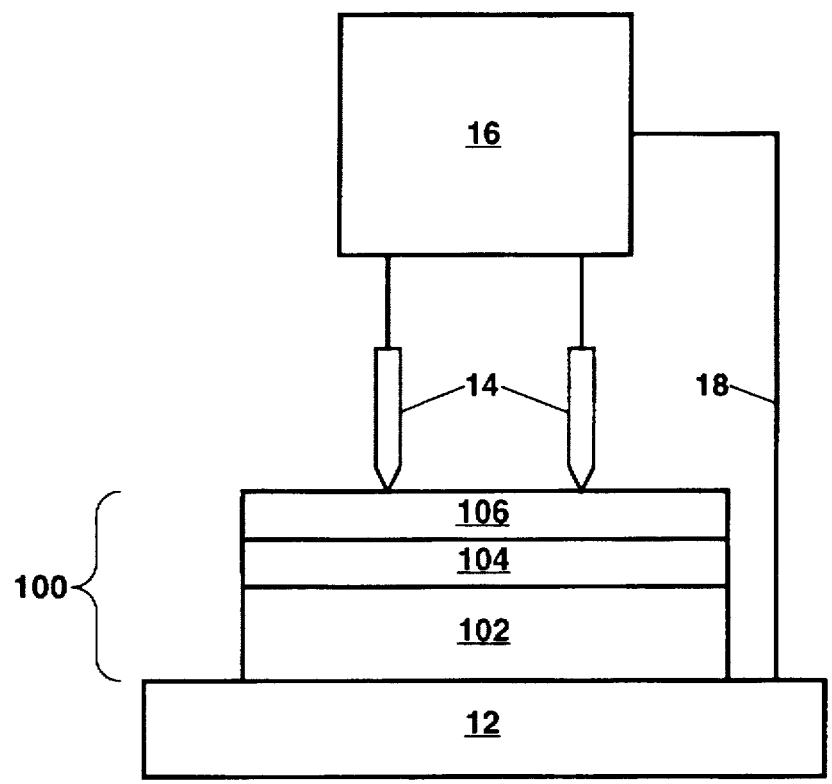
FIG. 1 shows a schematic diagram of a silicon-on-insulator (SOI) substrate being screened according to a first preferred embodiment of the present invention, with an electrical current-versus-voltage (I-V) characteristic being measured by applying a gate voltage to a bottom silicon support portion of the substrate and measuring a drain-to-source current in a top silicon layer of the substrate.

Referring to FIG. 1, there is shown a schematic diagram of a silicon-on-insulator (SOI) substrate 100 being screened according to a first preferred embodiment of the present invention. The silicon-on-insulator substrate 100, formed according to methods well-known to the art, comprises a thick (up to about 1 mm or more) bottom silicon support portion 102, a thin (up to about 1000 nm) silicon oxide (e.g. $SiO_2$) layer 104 formed above the bottom support portion, and a thin (up to a few microns) top silicon layer 106 overlying the oxide layer. The top layer and bottom portion preferably comprise monocrystalline silicon.

In FIG. 1, the SOI substrate prior to an electrical characterization thereof is prepared by an annealing step. The annealing step is performed by heating one or more substrates 100 to a first temperature in the range of about 450°–800° C. in a furnace (e.g. a quartz-lined tube furnace) and exposing the substrates to a defect-activating ambient (e.g. a hydrogen-containing ambient) for sufficient time to activate any defects in the oxide layer 104. After the annealing step, the substrates are removed from the furnace and cooled down to room temperature.

The defects of interest are primarily those defects that when activated trap positive charge in the oxide layer, compromising the integrity of the oxide layer (e.g. by providing a leakage current path through the oxide layer, or enhancing a current flow between a source and a drain of a MOSFET device, or reducing an electrical breakdown voltage of the oxide layer). The presence of any defects in the oxide layer that may later become activated (e.g. during IC fabrication) can thus affect the operation and/or reliability of any IC devices subsequently formed within the top silicon layer 106.

The defect-activating ambient for the annealing step preferably comprises a hydrogen-containing gas such as hydrogen, forming gas (defined herein as being up to about 20% hydrogen, with the remainder nitrogen) or ammonia. The time required for activating any defects in the oxide layer 104 will depend upon the temperature to which the substrates are heated, but generally a time period of about 20–60 minutes is sufficient.

Without this annealing step, the defects would be difficult if not impossible to detect by methods known to the art; but the defects could later be activated during fabrication of ICs, resulting in the production of defective or unreliable ICs with associated loss of time and money. By practice of the present invention, however, SOI substrates (or other semiconductor substrates having an oxide layer formed thereon or therein) may be selected and qualified as being known-good prior to IC fabrication, with any defects being below a predetermined level. (Any substrates having defects above the predetermined level would be identified according to the present invention; and these high-defect substrates could be either treated to passivate defects to below the predetermined level, or otherwise disposed of.) Thus, by screening substrates or wafers prior to IC fabrication, an overall yield of acceptable ICs may be increased with considerable savings in cost and time.

In FIG. 1, after the annealing step each SOI wafer is placed on an electrically conductive stage 12 for measuring a defect-revealing electrical characteristic of at least a portion of the oxide layer 104. A pair of electrodes 14 (i.e. electrical probes) in a spaced arrangement are provided for electrically contacting the top silicon layer 106. The electrodes (e.g. spring-loaded pointed-tip electrical probes spaced apart by about 1–5 mm) are brought into contact with the top silicon layer for making a temporary electrical connection thereto, preferably without damaging the substrate 100. The electrodes 14 in combination with the substrate 100 and stage 12 form a pseudo-MOSFET device that may be electrically characterized for revealing the activated defects within the oxide layer 104 without being destructive to the substrate 100 and without removing the top silicon layer.

According to the first preferred embodiment of the present invention shown in FIG. 1, the defect-revealing electrical characteristic is an electrical current-versus-voltage (I-V) characteristic of the pseudo-MOSFET device that is measured by a first electrical means 16 such as a transistor curve tracer or the like for characterizing transistor devices. The first electrical means 16 preferably provides a gate voltage (by a first electrical connection 18 to stage 12) to the bottom silicon support portion 102 of the substrate and further provides a drain-to-source current that flows through the portion of the top silicon layer between the electrodes 14. By varying the gate voltage, the drain-to-source current may be controlled and the resultant I-V characteristic of the pseudo-MOSFET may be measured by the first electrical means 16 and recorded or displayed.

Figure 2:
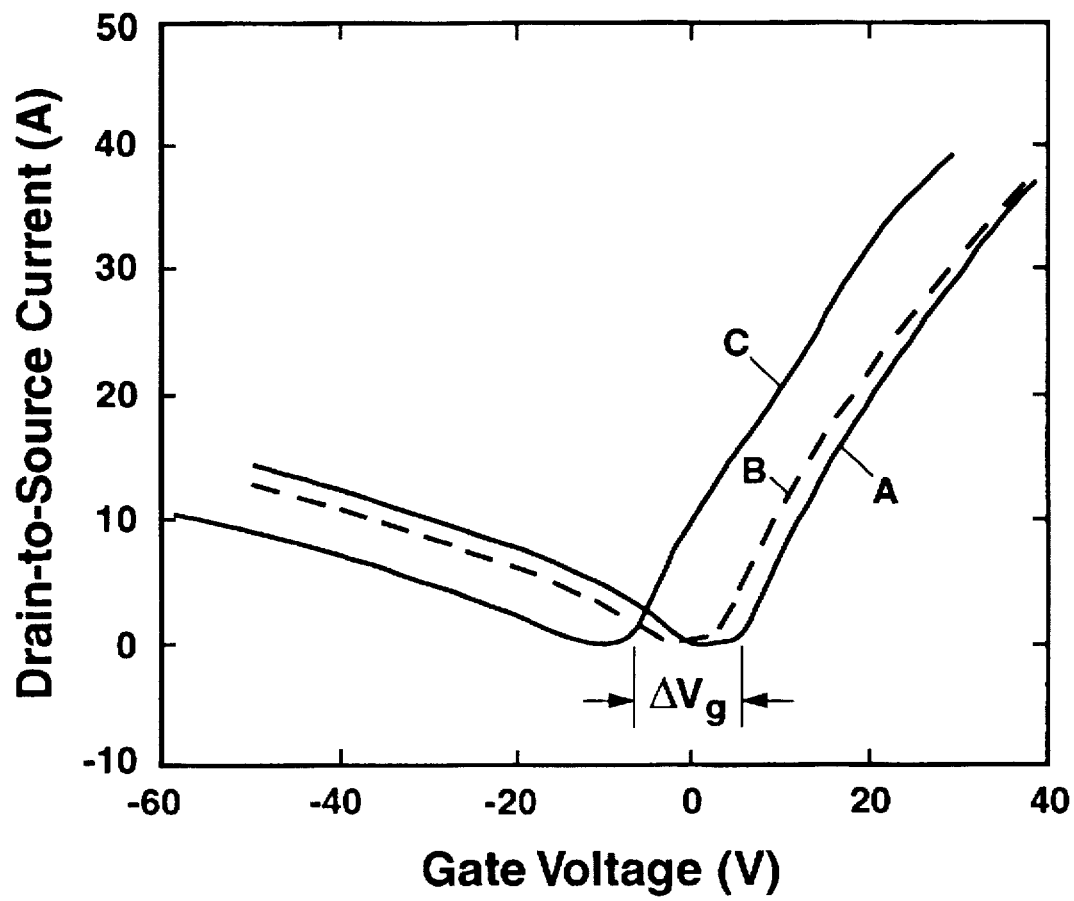
FIG. 2 shows electrical current-versus-voltage characteristic curves measured according to the present invention using the apparatus of FIG. 1 for characterizing an unannealed SOI substrate (curve A), and SOI substrates annealed in a forming-gas ambient at temperatures of 400° C. (curve B) and 550° C. (curve C) for about 30 minutes.

FIG. 2 shows electrical I-V characteristic curves measured according to the present invention using the apparatus of FIG. 1. In FIG. 2, I-V curves are shown for pseudo-MOSFET devices formed on three identical SOI substrates. The I-V curve labelled "A" is for an unannealed SOI substrate; and the curves labelled "B" and "C" are for SOI substrates annealed in a forming gas ambient for a period of about 30 minutes at annealing temperatures of 400° C. and 550° C., respectively. From these curves, the I-V characteristics of the pseudo-MOSFET are slightly altered by the annealing step. The curve labelled "C" in FIG. 2 for the SOI substrate annealed at 550° C. shows effects due a positive space charge in the oxide layer 104 produced by the activated defects. As a result of this positive space charge, a relatively large negative gate voltage (about −5 volts) is required to turn off the transistor. In FIG. 2, the drain-to-source current at a particular value of the gate voltage (e.g. 0 volts) or a gate voltage shift, $\Delta V_g$, above which the transistor is turned on may provide an indication or measure of a quantity of activated defects within the sampled portion of the wafer.

Thus, the I-V characteristic curves in FIG. 2 show that by practice of the present invention, at least a portion of the defects in the oxide layer of one or more SOI substrates may be activated and the presence of these activated defects may be revealed and quantified by forming a pseudo-MOSFET device with the apparatus in FIG. 1. Furthermore, each SOI substrate may be characterized either locally or globally by generating I-V curves at one or more predetermined locations wherein the electrodes 14 contact a surface of the substrate. (In moving from one location on the substrate to another location, the electrodes are preferably lifted from the surface of the substrate and repositioned with or without moving the stage holding the substrate.) This characterization allows an incidence or quantity of defects within the oxide layer to be measured locally or globally for screening one or more SOI substrates in a substantially non-destructive manner, and thereby assessing a quality of the substrates (e.g. defining substrates as being known-good substrates with defects below a predetermined level). A global measurement of substrates may be used, for example, to determine the presence of any significant lateral non-uniformities in a charge density of activated defects within an oxide layer. Such lateral non-uniformities, if present, may potentially affect the performance of ICs fabricated on the substrates.

The substrate quality may be determined either after manufacture of the substrates (e.g. by a substrate manufacturer) or prior to the fabrication of ICs on the substrates (e.g. by an IC fabrication facility). Such a screening method as taught according to the present invention may be used for a single SOI substrate selected from a lot or batch of substrates, or for each substrate in the lot or batch. SOI substrates having a quantity of defects below a predetermined level may then be used for the fabrication of ICs.

Those substrates having defects above the predetermined level may either be treated to passivate defects to below the predetermined level, or otherwise the substrates may be disposed of. A possible step for treating one or more substrates (i.e. a defect-passivation step) may be provided by heating the SOI substrates to a second temperature (e.g. about 700° C. or above) and exposing the substrates to a defect-passivation ambient for sufficient time for removing the activated defects to below the predetermined level. Such a defect-passivation ambient may be, for example, an oxygen-containing gas [e.g. oxygen gas ($O_2$), or oxygen gas in combination with a substantially inert gas such as $N_2$, Ar, He or Ne], or a vacuum for passivating at least a part of any of the positively-charged defects in the oxide layer; or a substantially inert gas (e.g. $N_2$, Ar, He or Ne) or vacuum for removing other types of defects generated by the initial annealing step in the defect-activating ambient.

Figure 3:
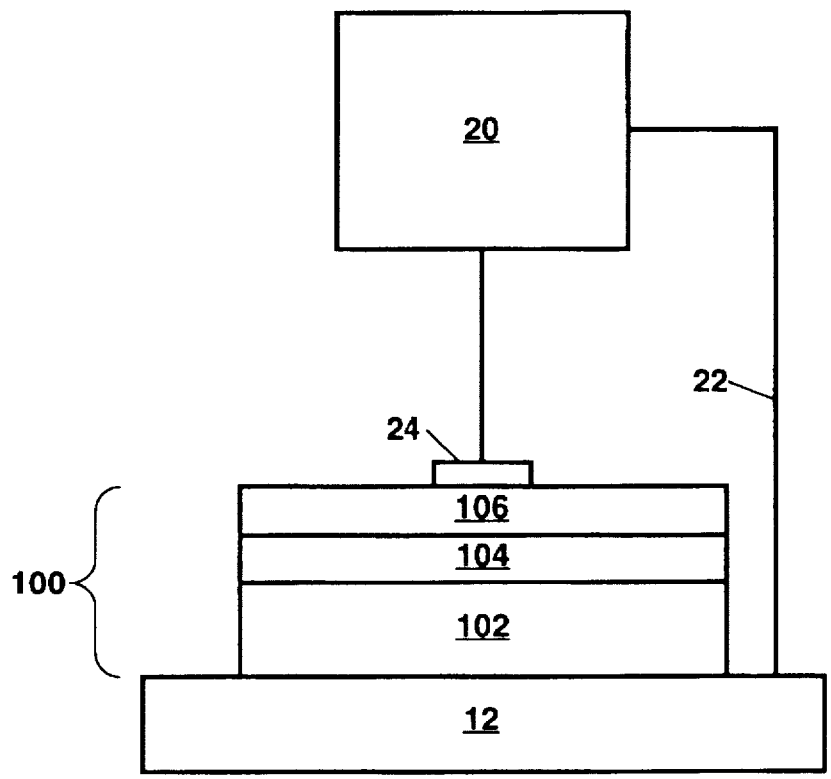
FIG. 3 shows a schematic diagram of a SOI substrate being screened according to a second preferred embodiment of the present invention, with an electrical capacitance-versus-voltage (C-V) characteristic being measured by applying an alternating-current (ac) voltage between the bottom silicon support portion of the substrate and a predetermined-area electrode above the oxide layer.

FIG. 3 shows a schematic diagram of a silicon-on-insulator (SOI) substrate 100 being screened according to a second preferred embodiment of the present invention. According to the second preferred embodiment, one or more substrates are annealed at the first temperature in the defect-activating ambient for sufficient time to activate any defects in the oxide layer as described heretofore.

After the annealing step, at least one of the substrates is placed on an electrically-conductive stage 12 for measuring a defect-revealing electrical characteristic of at least a portion of the oxide layer 104. According to the second preferred embodiment, the defect-revealing electrical characteristic for measuring an electrical charge in the oxide layer is a capacitance-versus-voltage (C-V) electrical characteristic. In FIG. 3, a second electrical means 20 is provided for measuring the C-V characteristic. The second electrical means 20 comprises an alternating-current (ac) capacitance bridge or the like as known to the art which provides a variable direct-current (dc) bias voltage with a superimposed ac voltage component (generally at a frequency of about 1 MHz) across a predetermined area of the oxide layer 104 for biasing the area and measuring a capacitance therein. The second electrical means is connected to the bottom silicon portion of the substrate by a second electrical connection 22 to the stage 12, and a predetermined-area contact 24 contacting the top silicon layer 106 (or a top surface of the oxide layer 104 in the event that the top silicon layer is omitted, or removed entirely or in part).

The predetermined-area contact 24 may be a patterned metal layer deposited on the surface of the substrate and forming one or more dots (e.g. aluminum dots having a predetermined area of about 1 mm$^2$, with the dots generally being removable by etching after the C-V measurement without substantially damaging the substrate); or the contact may be a surface probe (e.g. a mercury probe comprising an open-ended capillary tube with a predetermined size bore filled with mercury) contacting the surface of the substrate. The C-V measurement may be repeated at different locations on the substrate by providing a plurality of dot contacts, or by moving the surface probe.

Figure 4:
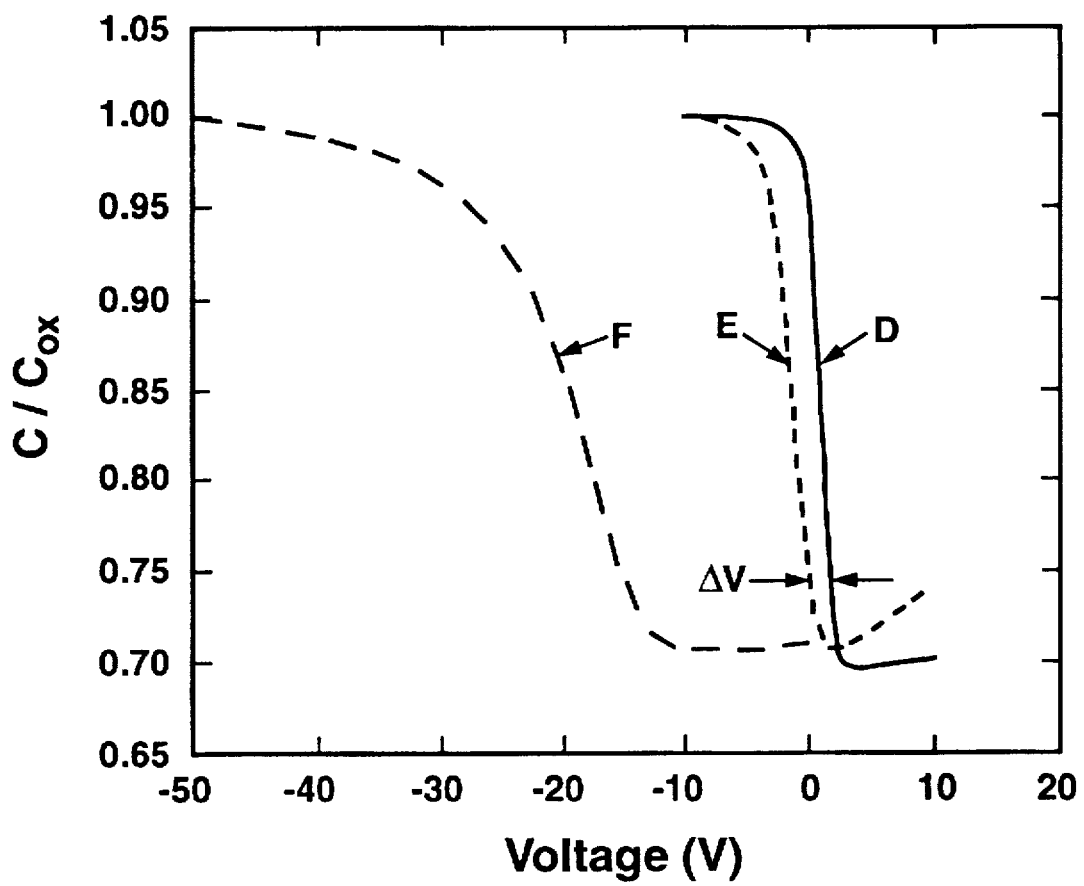
FIG. 4 shows a normalized capacitance-versus-voltage characteristic of three identical SIMOX substrates without any annealing step (curve D), and after annealing either in a nitrogen ambient (curve E) or a forming-gas ambient (curve F) at 550° C. for about 20 minutes.

FIG. 4 shows C-V measurement curves for a SOI substrate without any annealing step (curve D), and additional identical SOI substrates after annealing in a nitrogen ambient (curve E) and a forming-gas ambient (curve F) at a temperature of 550° C. for about 20 minutes. The SOI substrates in FIG. 4 were formed according to the separation by implantation of oxygen (SIMOX) process as described heretofore, with the oxide layer being about 400 nm thick and the top silicon layer being about 200 nm thick. For these measurements with doped (p-type) substrates, the top silicon layer was removed by etching in a potassium hydroxide (KOH) solution to facilitate the C-V measurement. For other embodiments of the present invention and especially with undoped silicon substrates, it should be possible to perform C-V measurements without removing the top silicon layer from the substrate, thereby providing a substantially non-destructive screening method. Alternately, a small area (e.g. about 1 mm$^2$) of the top silicon layer may be removed for performing the C-V measurements at one or more predetermined portions (e.g. near an edge of the substrate) that are not usable for forming ICs, thereby leaving other portions of the substrate usable for IC fabrication substantially undamaged.

In FIG. 4, the unannealed substrate provides a reference C-V curve (curve D) that may be used for comparing a shape and a mid-gap voltage shift, $\Delta V$, of the C-V curves for the annealed substrates. For each C-V curve in FIG. 4, a normalized capacitance ($C/C_{OX}$) is plotted as a function of the dc bias voltage. (A reference capacitance, $C_{OX}$, used to normalize the curves may be, for example, the capacitance measured for the unannealed substrate at a bias voltage of about −10 volts.) The shape of the reference C-V curve D in FIG. 4 is due to a variation with applied bias voltage of a charge applied to a metal-oxide-semiconductor (MOS) capacitor formed by the oxide layer 104, the underlying bottom silicon portion 102 and the overlying contact 24. Any charged defects (e.g. positively-charged activated defects) within the oxide layer 104 may further act to alter the shape and mid-gap voltage shift, $\Delta V$, of the C-V curves of the annealed substrates relative to the reference curve D, thereby providing an indication of a nature and quantity of defects within the oxide layer. The mid-gap voltage shift, $\Delta V$, is related to the quantity of charged defects as an integral over a volume density of defects, $\rho(x)$:

$$\Delta V = -\left(\frac{q}{\epsilon\epsilon_0}\right) \int x\rho(x)dx$$

where q is a charge constant, and $\epsilon\epsilon_0$ is a dielectric constant of the oxide layer.

In FIG. 4, the SOI substrate annealed in a nitrogen gas (N$_2$) ambient (curve E) shows a very small mid-gap voltage shift, $\Delta V$, of about 2 volts indicating a relatively low quantity of activated defects in the oxide layer. (This low quantity of activated defects is not expected to adversely affect any ICs formed on the substrate.) By annealing another identical SOI substrate in a hydrogen-containing ambient comprising forming gas consisting of about 5% by volume hydrogen and the remainder nitrogen, the C-V curve labelled "F" shows a much larger quantity of activated defects (estimated to be about 10$^{12}$ cm$^{-2}$ from the mid-gap voltage shift, $\Delta V$, of about 20 volts).

The same density of defects is expected to be present in the oxide layer of each of the above identical SOI substrates. However, it is only by annealing in the hydrogen-containing ambient that a majority of the defects are activated and their presence revealed in the C-V curves. This is due to the presence of two types of defects in the oxide layer of each SOI substrate. A first defect type is an interface defect that is localized at an oxide-silicon interface where the oxide layer contacts the bottom silicon portion. The charge of these interface defects depends on the gate voltage. A second defect type is a positively-charged center. Annealing in the N$_2$ ambient is generally much less effective for activating defects than annealing in the hydrogen-containing ambient, accounting for the larger quantity of defects measured in curve F. (The stretch-out in curve F may indicate the presence of lateral non-uniformities in the positively-charged activated defects within the oxide layer. Such lateral non-uniformities may be related to silicon clusters or pipes which may agglomerate, thereby lowering an electrical breakdown voltage of the oxide layer.)

By annealing one or more SIMOX substrates in the hydrogen-containing ambient, a majority of defects may become positively charged and reveal their presence and quantity in the C-V measurements (or with the I-V measurement described heretofore). The screening method of the present invention in its various embodiments is applicable to SIMOX substrates formed by any of the different SIMOX processes as known to the art (including single, multiple and supplemental oxygen ion implants). Furthermore, embodiments of the present invention are also applicable to other types of substrates having an oxide layer formed thereon or therein. This includes silicon substrates wherein the oxide layer is a thermal oxide layer formed, for example, by heating the substrates to a temperature above about 700° C. in an oxygen-containing ambient for sufficient time for forming the oxide layer by a chemical reaction at a surface of the silicon substrate; and silicon substrates wherein the oxide layer is deposited on a surface of the substrate by an oxide deposition process as known to the art (e.g. chemical vapor deposition).

The screening of thermal-oxide substrates according to the present invention is advantageous in that substrates may be selected for later fabrication of ICs, with one or more subsequent process steps being provided during IC fabrication for forming a polycrystalline silicon top layer 106 above the thermal oxide (e.g. for forming transistor gates and resistors). Alternately, a top silicon layer may be formed above the thermal oxide layer by a deposition process (e.g. depositing polycrystalline silicon) prior to the fabrication of ICs.

Figure 5:
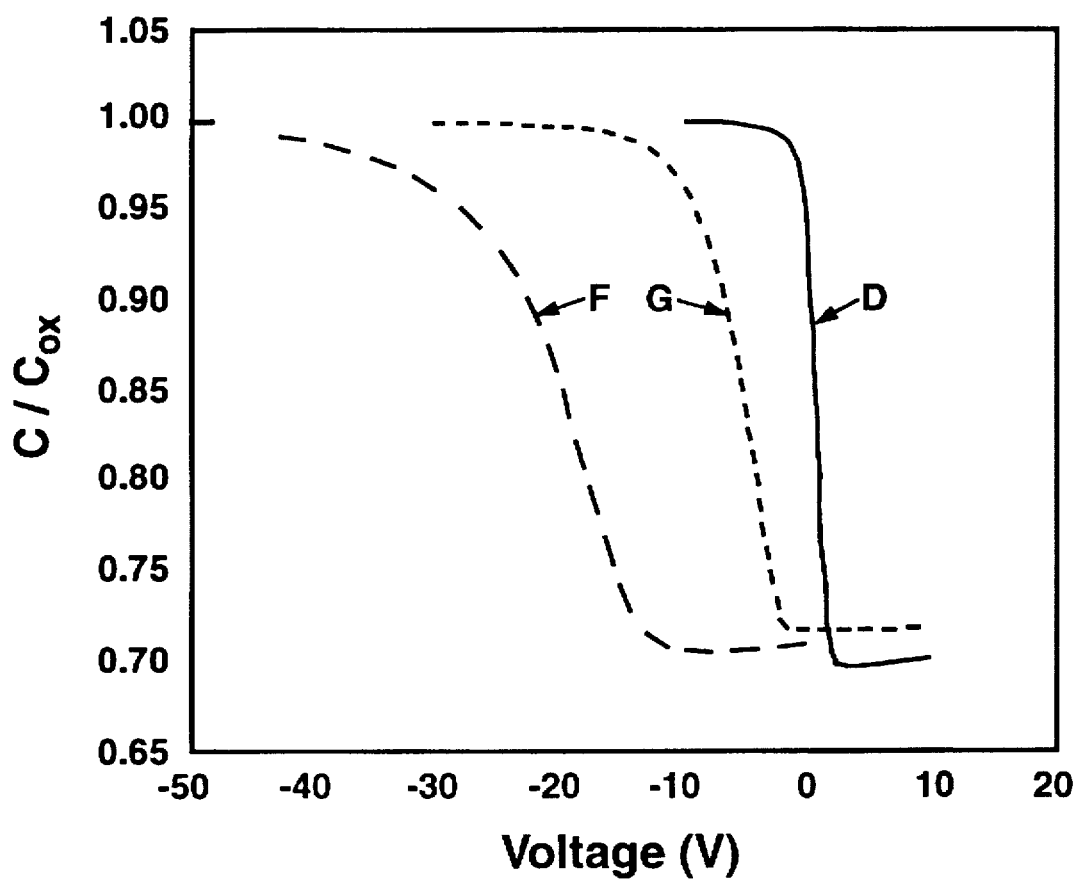
FIG. 5 shows a comparison of a SIMOX substrate (curve D) without any annealing step, and SIMOX and thermal-oxide substrates after annealing in a forming-gas ambient at 550° C. for about 20 minutes (annealed SIMOX substrate shown as curve F, and annealed thermal-oxide substrate shown as curve G).

Use of the second preferred embodiment of the present invention for screening thermal-oxide substrates and measuring defects therein is shown in FIG. 5. In FIG. 5, the C-V characteristic curves D and F for the SIMOX substrates are reproduced from FIG. 4; and an additional curve is shown for an annealed thermal-oxide substrate (curve G). Each of the annealed substrates in FIG. 5 was annealed in a forming-gas ambient at a temperature of 550° C. for about 20 minutes.

In FIG. 5, the thermal-oxide substrates were formed by oxidizing p-type silicon (100) substrates in a dry O$_2$ ambient at a temperature of about 1050° C. for sufficient time to form a thermal oxide layer having a thickness of about 430 nm. The thermal oxide layer was then covered with a 200-nm polycrystalline silicon layer (i.e. a top silicon layer 106) formed by a chemical vapor deposition (CVD) process at 620° C. using silane ($SiH_4$) as a source gas. Finally, a 500-nm-thick $SiO_2$ overlayer was deposited above the polycrystalline silicon layer using CVD at a temperature of about 300° C. with silane and nitrous oxide ($N_2O$) as source gases. The $SiO_2$ overlayer and polycrystalline silicon layer were removed for C-V measurements with the apparatus of FIG. 3.

In FIG. 5, after the annealing step in the hydrogen-containing ambient, a positive charge is generated in both the SIMOX and thermal-oxide substrates by the activated defects (curves F and G, respectively). Similar C-V characteristics were measured for other thermal-oxide substrates after the forming-gas annealing step, with the other substrates having oxide layer thicknesses ranging from about 400 to about 1000 nm.

In FIG. 5, the thermal-oxide substrate shows a smaller mid-gap voltage shift, indicating fewer activated defects and demonstrating the utility of the screening method for selecting among a plurality of substrates and identifying those substrates having defects below a predetermined level. The predetermined level of defects may be determined, for example, by initially characterizing a small quantity of SOI substrates prior to IC fabrication and then measuring a yield of acceptable or reliable ICs fabricated with those characterized substrates and identifying a predetermined level of defects which meets a specified yield for the ICs (e.g. a level of defects below which the yield is not significantly increased, and above which the yield is adversely impacted). Then the predetermined level of defects may be used for screening additional SOI substrates for the fabrication of ICs so that the specified yield of ICs is met.

The screening method of present invention in its various embodiments is advantageous for revealing activated defects in one or more SOI substrates prior to IC fabrication so that any substrates having defects above a predetermined level may be discovered and removed, or subjected to a defect-passivation step prior to IC fabrication. This is especially important since during IC fabrication some form of an annealing process step in a hydrogen-containing ambient is likely to be encountered; and such an IC process step might activate defects in the substrates, thereby producing defective or unreliable ICs with a loss in yield and an increase in manufacturing cost.

The matter set forth in the foregoing description and accompanying drawings is offered by way of illustration only and not as a limitation. Other applications and variations of the non-destructive screening method of the present invention will become evident to those skilled in the art. In particular, the present invention may be used for screening of other types of semiconductor substrates formed by processes known to the art, including zone melting and recrystallization (ZMR) substrates, bonded and etched back (BESOI) substrates, full isolation by oxidized porous silicon (FIPOS) substrates, epitaxial layer overgrowth (ELO) substrates and unibond substrates. The actual scope of the invention is intended to be defined in the following claims when viewed in their proper perspective based on the prior art.

What is claimed is:

1. A screening method for selecting one or more silicon-on-insulator substrates for integrated circuit fabrication comprising steps for:

(a) annealing the semiconductor substrates at a first temperature in a defect-activating ambient for sufficient time to activate any defects within an oxide layer of the substrates; and (b) measuring an electrical charge in the oxide layer for providing an indication of a quantity of the activated defects within the oxide layer of the substrates.

2. The screening method of claim 1 wherein the defect-activating ambient comprises a hydrogen-containing gas.

3. The screening method of claim 2 wherein the hydrogen-containing gas is selected from the group consisting of hydrogen, forming gas and ammonia.

4. The screening method of claim 2 wherein the defect-activating ambient comprises about 1–20% hydrogen and the remainder nitrogen.

5. The screening method of claim 4 wherein the first temperature is in the range of about 450°–800° C., and the time sufficient for activating the defects is about 20–60 minutes.

6. The screening method of claim 5 wherein the first temperature is about 500° C., and the time sufficient for activating the defects is about 30 minutes.

7. The screening method of claim 1 wherein the step for measuring the electrical charge in the oxide layer comprises applying a direct-current (dc) bias voltage with an alternating-current (ac) voltage component across an area of the oxide layer and measuring a capacitance thereacross.

8. The screening method of claim 1 wherein the step for measuring the electrical charge in the oxide layer comprises flowing an electrical current through a portion of a top silicon layer above the oxide layer and measuring a variation in the current flow in response to a varying gate voltage applied to a bottom silicon portion of the substrates.

9. The screening method of claim 1 wherein the oxide layer is formed by a step for implanting oxygen ions into the substrates followed by a step for annealing the substrates at a temperature above about 1000° C. for sufficient time to form the oxide layer.

10. The screening method of claim 1 further including a defect-passivation step that comprises heating the substrates in a defect-passivation ambient at a second temperature for sufficient time for passivating a part of the defects.

11. The screening method of claim 10 wherein the defect-passivation ambient comprises at least in part oxygen gas.

12. The screening method of claim 10 wherein the defect-passivation ambient comprises at least in part a substantially inert gas.

13. The screening method of claim 10 wherein the defect-passivation ambient comprises a vacuum.

14. The screening method of claim 1 wherein the steps for annealing the semiconductor substrates and measuring the electrical charge in the oxide layer of the substrates are non-destructive to the substrates.

15. A screening method for selecting a semiconductor substrate for integrated circuit fabrication comprising steps for:

(a) annealing the substrate at a first temperature in a defect-activating ambient for sufficient time to activate a majority of any defects present within an oxide layer of the substrate;

(b) measuring a defect-revealing electrical characteristic of at least a portion of the oxide layer for determining a quantity of defects therein; and (c) selecting substrates for which the measured quantity of defects qualifies the substrates as known-good substrates for use in integrated circuit fabrication.

16. The screening method of claim 15 wherein the semiconductor substrate is a silicon-on-insulator substrate and the oxide layer is formed below a surface of the substrate.

17. The screening method of claim 15 wherein the semiconductor substrate is a silicon substrate and the oxide layer is formed on a surface of the substrate.

18. The screening method of claim 17 wherein the oxide layer is formed by a thermal process wherein the silicon substrate is heated to a temperature above about 700° C. in an oxygen-containing ambient for sufficient time for forming the oxide layer.

19. The screening method of claim 15 wherein the oxide layer is formed by a deposition process.

20. The screening method of claim 15 wherein the steps for annealing the substrate and measuring the defect-revealing electrical characteristic of the oxide layer are non-destructive to the substrate.

21. A method for selecting a silicon-on-insulator substrate for integrated circuit fabrication comprising the steps of:
  (a) heating the substrate to a temperature in the range of about 450°–800° C. and exposing the heated substrate to a hydrogen-containing ambient for about 20–60 minutes for activating a majority of any defects within the substrate;
  (b) measuring a defect-revealing electrical characteristic of at least a portion of the substrate for determining a quantity of activated defects therein; and
  (c) selecting substrates for which the quantity of activated defects qualifies the substrates as known-good substrates for use in integrated circuit fabrication.

22. The method of claim 21 wherein the hydrogen-containing ambient comprises a gas selected from the group consisting of hydrogen, forming gas and ammonia.

23. The method of claim 21 wherein the defect-revealing electrical characteristic is a capacitance-versus-voltage (C-V) characteristic.

24. The method of claim 20 wherein the defect-revealing electrical characteristic is a current-versus-voltage (I-V) characteristic in a pseudo-MOSFET device formed within the portion of the substrate.

25. The method of claim 21 wherein the step of measuring the defect-revealing electrical characteristic does not produce any substantial damage to portions of the substrate usable for integrated circuit fabrication.

26. A method for fabricating integrated circuits with an improved reliability comprising the steps of:
  (a) selecting at least one silicon-on-insulator substrate having a quantity of defects that qualifies each substrate as a known-good substrate, the selection step further comprising a step for annealing each substrate in a hydrogen-containing ambient for sufficient time for activating a majority of any defects within each substrate, followed by a step for measuring a defect-revealing electrical characteristic of at least a portion of each substrate for determining a quantity of the activated defects therein; and
  (b) forming a plurality of semiconductor devices on a surface of each known-good substrate.

* * * * *